US010424710B2

(12) United States Patent
Salvador et al.

(10) Patent No.: US 10,424,710 B2
(45) Date of Patent: Sep. 24, 2019

(54) ENGINE WITH CYLINDER LINER HAVING A THERMOELECTRIC MODULE, AND METHOD OF OPERATING THE ENGINE

(71) Applicant: GM GLOBAL TECHNOLOGY OPERATIONS LLC, Detroit, MI (US)

(72) Inventors: James R. Salvador, Royal Oak, MI (US); Anil Bika, Rochester Hills, MI (US); Alok Warey, Novi, MI (US); Venkatesh Gopalakrishnan, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 15/723,488

(22) Filed: Oct. 3, 2017

(65) Prior Publication Data

US 2019/0103537 A1 Apr. 4, 2019

(51) Int. Cl.
*F02F 1/00* (2006.01)
*H01L 35/30* (2006.01)
*F02G 5/00* (2006.01)
*F02F 1/02* (2006.01)

(52) U.S. Cl.
CPC .............. *H01L 35/30* (2013.01); *F02F 1/004* (2013.01); *F02F 1/02* (2013.01); *F02G 5/00* (2013.01)

(58) Field of Classification Search
CPC ... G01B 21/042; G01B 9/02072; F02F 1/004; F02F 1/02; F02G 5/00; H01L 35/30

USPC .......... 216/13, 19, 33, 67; 123/193.2, 193.5, 123/193.6
See application file for complete search history.

(56) References Cited

U.S. PATENT DOCUMENTS

| | | | |
|---|---|---|---|
| 6,029,620 A | 2/2000 | Zinke | |
| 7,739,994 B2 * | 6/2010 | Mcgilvray | F02B 63/04 123/193.5 |
| 8,037,851 B2 * | 10/2011 | Kobayashi | F01P 3/02 123/142.5 R |
| 2008/0072948 A1 | 3/2008 | McGilvray et al. | |
| 2009/0031978 A1 * | 2/2009 | Kobayashi | F01P 3/02 123/142.5 R |
| 2016/0256921 A1 * | 9/2016 | Maki | B29C 33/52 |

* cited by examiner

*Primary Examiner* — Lan Vinh
(74) *Attorney, Agent, or Firm* — Quinn IP Law

(57) ABSTRACT

An engine includes a cylinder liner. The cylinder liner includes an interior wall, an exterior wall, and a thermoelectric element disposed therebetween. The interior wall forms a cylinder bore forming part of a combustion chamber. The exterior wall is positioned adjacent a coolant jacket. The thermoelectric element is operable to generate an electric current in response to a temperature gradient between the interior wall, which is exposed to the high temperatures of the combustion chamber, and the exterior wall, which is exposed to the cooler temperatures of a coolant in the coolant jacket. An electric current in a circuit of the thermoelectric element may be controlled to affect a cylinder wall temperature. The circuit of the thermoelectric element may be opened, and the voltage of the thermoelectric element may be measured and used to calculate the cylinder wall temperature.

20 Claims, 3 Drawing Sheets

ENGINE WITH CYLINDER LINER HAVING A THERMOELECTRIC MODULE, AND METHOD OF OPERATING THE ENGINE

INTRODUCTION

The disclosure generally relates to an engine having a cylinder liner, and a method of operating the engine.

Internal combustion engines combust a fuel, e.g., diesel fuel or gasoline, to generate power. Much of the energy released during combustion is lost, either through discharge of the exhaust gasses, or through the engine cooling system. Thermoelectric elements, sometimes referred to as a thermoelectric generator or a thermoelectric module, use a temperature gradient between two opposing plates to generate an electrical current. The thermoelectric element may be used to convert waste thermal energy from the engine combustion process into electrical energy.

SUMMARY

An engine is provided. The engine includes a block, which defines a cavity. A cylinder liner is disposed within the cavity. The cylinder liner includes an interior wall, an exterior wall, and a thermoelectric element. The interior wall forms a cylinder bore that extends along a bore axis. The exterior wall is spaced from and disposed radially outside the interior wall, relative to the bore axis. The thermoelectric element is disposed between the interior wall and the exterior wall of the cylinder liner. The thermoelectric element is operable to generate an electric current in response to a temperature gradient between the interior wall and the exterior wall.

In one embodiment of the engine, each of the interior wall and the exterior wall is a metal, such as but not limited to, a steel alloy.

In one aspect of the engine, the block defines a coolant jacket that is disposed adjacent the exterior wall of the cylinder liner. The coolant jacket circulates a coolant therethrough for cooling the block. In one embodiment of the engine, the exterior wall of the cylinder liner is exposed to the coolant in the coolant jacket.

In another aspect of the engine, a cylinder head is attached to the block, and a piston is moveably disposed within the cylinder bore. The interior wall of the cylinder liner, the cylinder head, and the piston cooperate to form a combustion chamber therebetween.

In one aspect of the engine, the cylinder liner includes a hot side electrical insulator that is disposed between the interior wall and the thermoelectric element. In another aspect of the engine, the cylinder liner includes a cold side electrical insulator disposed between the exterior wall and the thermoelectric element.

In one aspect of the engine, the thermoelectric element includes at least one n-type semiconductor and at least one p-type semiconductor joined together in electrical communication. The thermoelectric element includes a hot side electrical conductor electrically connecting the p-type semiconductors and the n-type semiconductors. In another aspect of the engine, the thermoelectric element further includes a circuit having a lead connected to the n-type semiconductors and the p-type semiconductors.

A cylinder liner for an internal combustion engine is also provided. The cylinder liner includes an interior wall forming a cylinder bore that extends along a bore axis. An exterior wall is spaced from and disposed radially outside the interior wall, relative to the bore axis. A thermoelectric element is disposed between the interior wall and the exterior wall. The thermoelectric element is operable to generate an electric current in response to a temperature gradient between the interior wall and the exterior wall.

In one aspect of the cylinder liner, the thermoelectric element includes a hot side electrical insulator disposed between the interior wall and the thermoelectric element, and a cold side electrical insulator disposed between the exterior wall and the thermoelectric element. The thermoelectric element further includes at least one n-type semiconductor and at least one p-type semiconductor joined together in electrical communication.

In another aspect of the engine, the thermoelectric element includes a hot side electrical conductor electrically connecting the p-type semiconductors and the n-type semiconductors, and a circuit having a lead connected to the n-type semiconductors and the p-type semiconductors.

A method of operating an engine is also provided. The method includes providing the engine with a thermoelectric element that is positioned between a combustion chamber of a cylinder, and a coolant jacket of the engine. The engine is operated by igniting a fuel within the combustion chamber, whereby a temperature gradient is created between the combustion chamber and the coolant jacket. An electric current is generated in a circuit, with the thermoelectric element. The thermoelectric element uses the temperature gradient between the combustion chamber and the coolant jacket to generate the electric current. The electric current in the circuit, which is generated by the thermoelectric element, is controlled with an engine controller, to affect a temperature within the cylinder.

In one aspect of the method of operating the engine, providing the engine with the thermoelectric element positioned between the combustion chamber of the cylinder, and the coolant jacket, includes positioning a cylinder liner within a cavity of a block. The cylinder liner includes an interior wall forming the cylinder, and an exterior wall spaced from and disposed radially outside the interior wall relative to a bore axis. The thermoelectric element is disposed between the interior wall and the exterior wall of the cylinder liner. The block defines a coolant jacket disposed adjacent to the exterior wall of the cylinder liner.

In one aspect of the method of operating the engine, controlling the electric current in the circuit to affect the temperature within the cylinder includes increasing the electric current in the circuit to reduce the temperature within the cylinder. In another aspect of the method of operating the engine, controlling the electric current in the circuit to affect the temperature within the cylinder includes decreasing the electric current in the circuit to increase the temperature within the cylinder.

In one aspect of the method of operating the engine, the circuit is opened to block the electric current in the circuit. An open circuit voltage of the thermoelectric element is measured after the circuit is opened. A cylinder temperature is calculated with the engine controller, from the open circuit voltage of the thermoelectric element.

Accordingly, the thermoelectric element, which is incorporated into the cylinder liner which forms the cylinder, may use the large temperature gradient between the combustion chamber in the cylinder and the coolant jacket to generate the electric current in the circuit. By controlling the electric current in the circuit of the thermoelectric element, the amount of thermal energy that is converted into electrical energy by the thermoelectric element is controlled, which controls or affects the temperature of the cylinder liner, i.e., the in-cylinder temperature. Accordingly, the thermoelectric element may be controlled to adjust the in-cylinder temperature. Additionally, when the circuit is opened, the resistance in the thermoelectric element may be used to calculate the temperature of the cylinder liner.

The above features and advantages and other features and advantages of the present teachings are readily apparent from the following detailed description of the best modes for carrying out the teachings when taken in connection with the accompanying drawings.

DETAILED DESCRIPTION

Those having ordinary skill in the art will recognize that terms such as "above," "below," "upward," "downward," "top," "bottom," etc., are used descriptively for the figures, and do not represent limitations on the scope of the disclosure, as defined by the appended claims. Furthermore, the teachings may be described herein in terms of functional and/or logical block components and/or various processes. It should be realized that such block components may be comprised of a number of hardware, software, and/or firmware components configured to perform the specified functions.

Referring to the FIGS., wherein like numerals indicate like parts throughout the several views, an engine is generally shown at 20. The engine 20 is an internal combustion engine 20. The engine 20 may be incorporated into a vehicle, such as a car, truck, atv, snowmobile, motorcycle, train, plane, or some other moveable platform. Alternatively, the engine 20 may be stationary, and incorporated into some other article of manufacture, such as a generator, etc.

Figure 1:
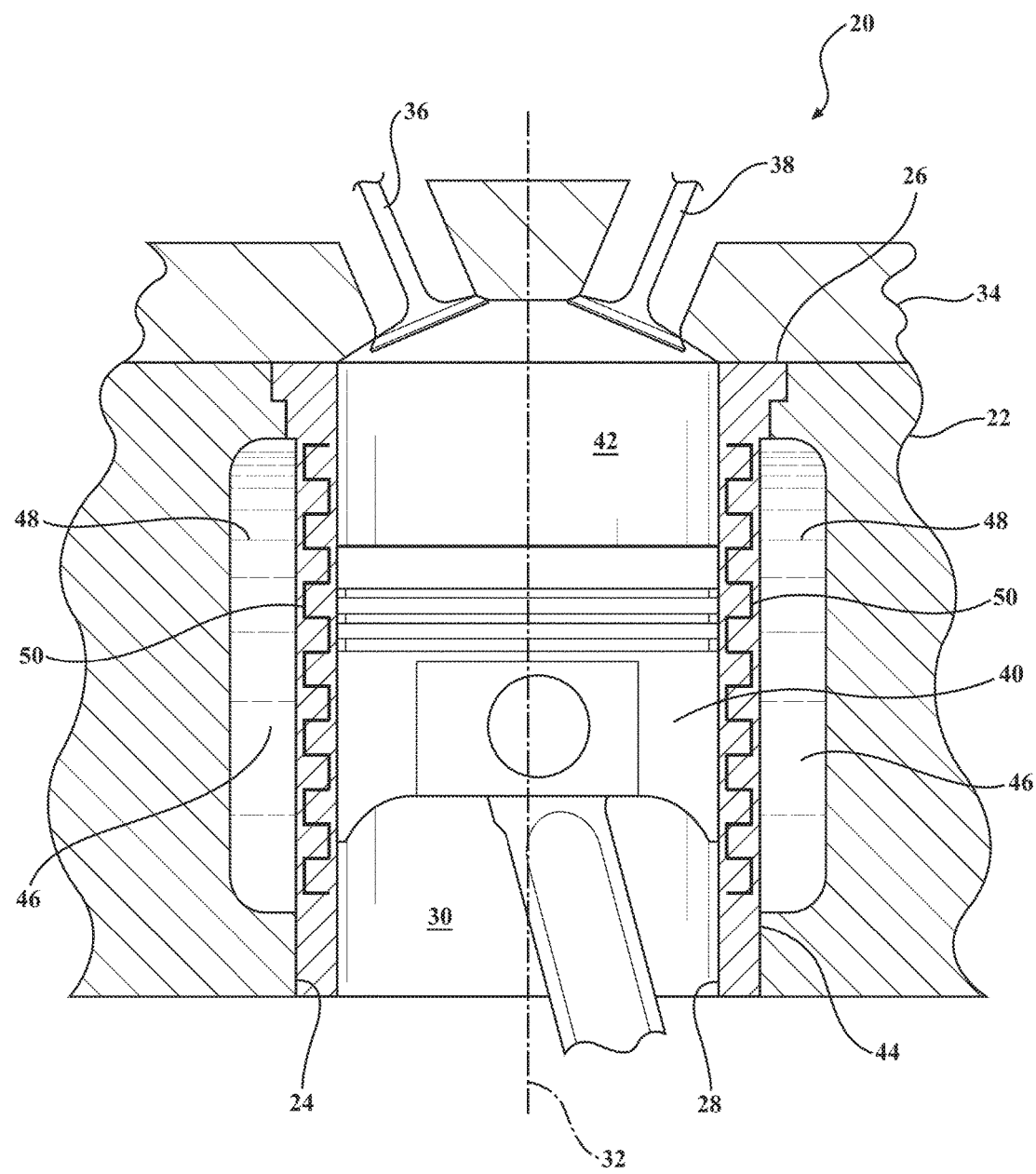
FIG. 1 is a schematic fragmentary cross sectional view of an engine.
Figure 2:
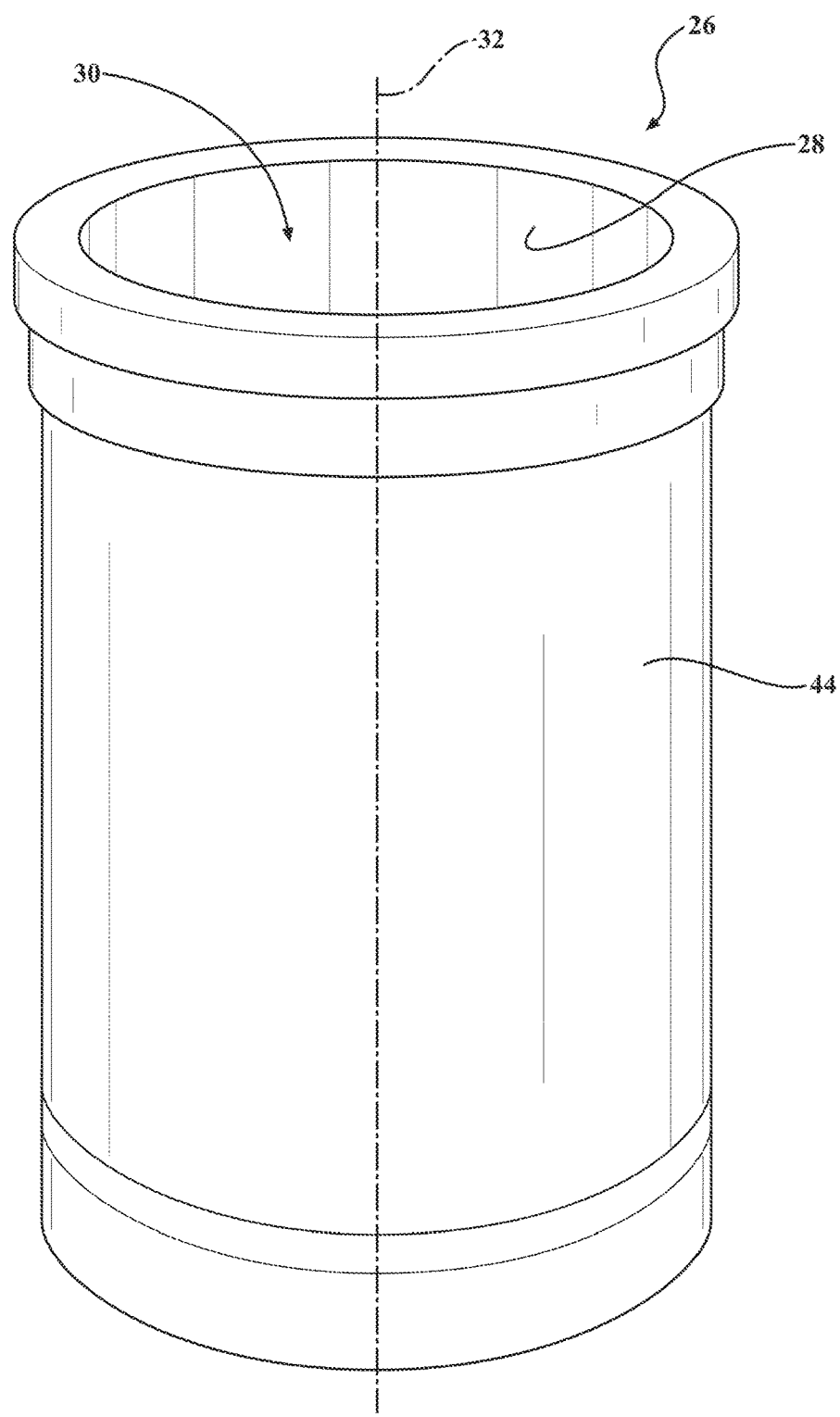
FIG. 2 is a schematic perspective view of a cylinder liner.

Referring to FIG. 1, the engine 20 includes a block 22, which defines a cavity 24. A cylinder liner 26 (also shown in FIG. 2) is disposed within the cavity 24. The cylinder liner 26 includes an interior wall 28 that forms a cylinder bore 30, extending along a bore axis 32. In one exemplary embodiment, the interior wall 28 of the cylinder liner 26 is manufactured from a material having a high thermal conductivity, such as a metal. The metal may include, but is not limited to, steel or steel alloy. A cylinder head 34 is attached to the block 22, and covers an upper end of the cylinder bore 30. The cylinder head 34 may include, but is not limited to, one or more intake valves 36, one or more exhaust valves 38, a fuel injector (not shown), etc. A piston 40 is moveably disposed within the cylinder bore 30, for reciprocating motion, as is understood by those skilled in the art. The interior wall 28 of the cylinder liner 26, the cylinder head 34, and the piston 40 cooperate to form a combustion chamber 42 therebetween. During operation of the engine 20, combustion of a fuel/air mixture occurs within the combustion chamber 42, thereby releasing large quantities of heat. Temperatures within the combustion chamber 42 during combustion may reach as high as 1100° C. The heat released from the combustion of the fuel/air mixture increases the temperature of the block 22, cylinder liner 26, cylinder head 34, and piston 40.

As noted above, the cylinder liner 26 includes the interior wall 28, which forms the cylinder bore 30. The cylinder liner 26 further includes an exterior wall 44. The exterior wall 44 is spaced from and disposed radially outside the interior wall 28 relative to the bore axis 32. In one exemplary embodiment the exterior wall 44 is manufactured from a material having a high thermal conductivity, such as a metal. The metal may include, but is not limited to, steel or a steel alloy.

The block 22 defines at least one coolant jacket 46, often referred to as a water jacket. The coolant jacket 46 is disposed adjacent the exterior wall 44 of the cylinder liner 26. The coolant jacket 46 circulates a coolant 48 through the coolant jacket 46 for removing heat from the components of the engine 20. The coolant 48 is circulated through a heat exchanger, such as a radiator (not shown), to dissipate the heat to the atmosphere. Typically, during normal operation, the temperature of the coolant 48 is maintained at slightly less than 100° C.

In one exemplary embodiment of the engine 20, the exterior wall 44 of the cylinder liner 26 is directly exposed to and in contact with the coolant 48 in the coolant jacket 46. In other embodiments, the exterior wall 44 of the cylinder liner 26 may be disposed near, but not in direct contact or exposed to the coolant 48 in the coolant jacket 46. For example, the cylinder liner 26 may be separated from the coolant jacket 46, by portions of the block 22, by a distance of approximately 50 mm or less.

The cylinder liner 26 includes a thermoelectric element 50 disposed between the interior wall 28 and the exterior wall 44. The thermoelectric element 50 may alternatively be referred to as a thermoelectric module or a thermoelectric generator. The thermoelectric element 50 is operable to generate an electric current in response to a temperature gradient between the interior wall 28 and the exterior wall 44 of the cylinder liner 26. As such, the thermoelectric element 50 converts some of the heat from combustion of the fuel/air mixture into useful electrical energy. As understood by those in the art, when a temperature gradient is imposed on a conductor of the thermoelectric element 50 under open circuit 64 conditions, a steady-state potential difference between a high temperature side of the conductor and a low temperature side of the conductor is created. In a closed circuit 64 condition, the thermoelectric element 50 generates an electric current as long as the temperature gradient is maintained. The interior wall 28 of the cylinder liner 26 functions as a hot side heat source, and the exterior wall 44 of the cylinder liner 26 functions as a cold side heat sink. As used herein, the term "hot side" refers to the side of the cylinder liner 26 nearest the combustion chamber 42, and the term "cold side" refers to the side of the cylinder liner 26 farthest from the combustion chamber 42, and nearest the coolant jacket 46. By positioning the high temperature side of the conductor adjacent the interior wall 28 of the cylinder liner 26, which is exposed to the high combustion temperatures within the combustion chamber 42, and positioning the low temperature side of the conductor adjacent the exterior wall 44 of the cylinder liner 26, which is exposed to the much lower temperatures of the coolant 48 in the coolant jacket 46, a high temperature gradient is obtainable.

Figure 3:
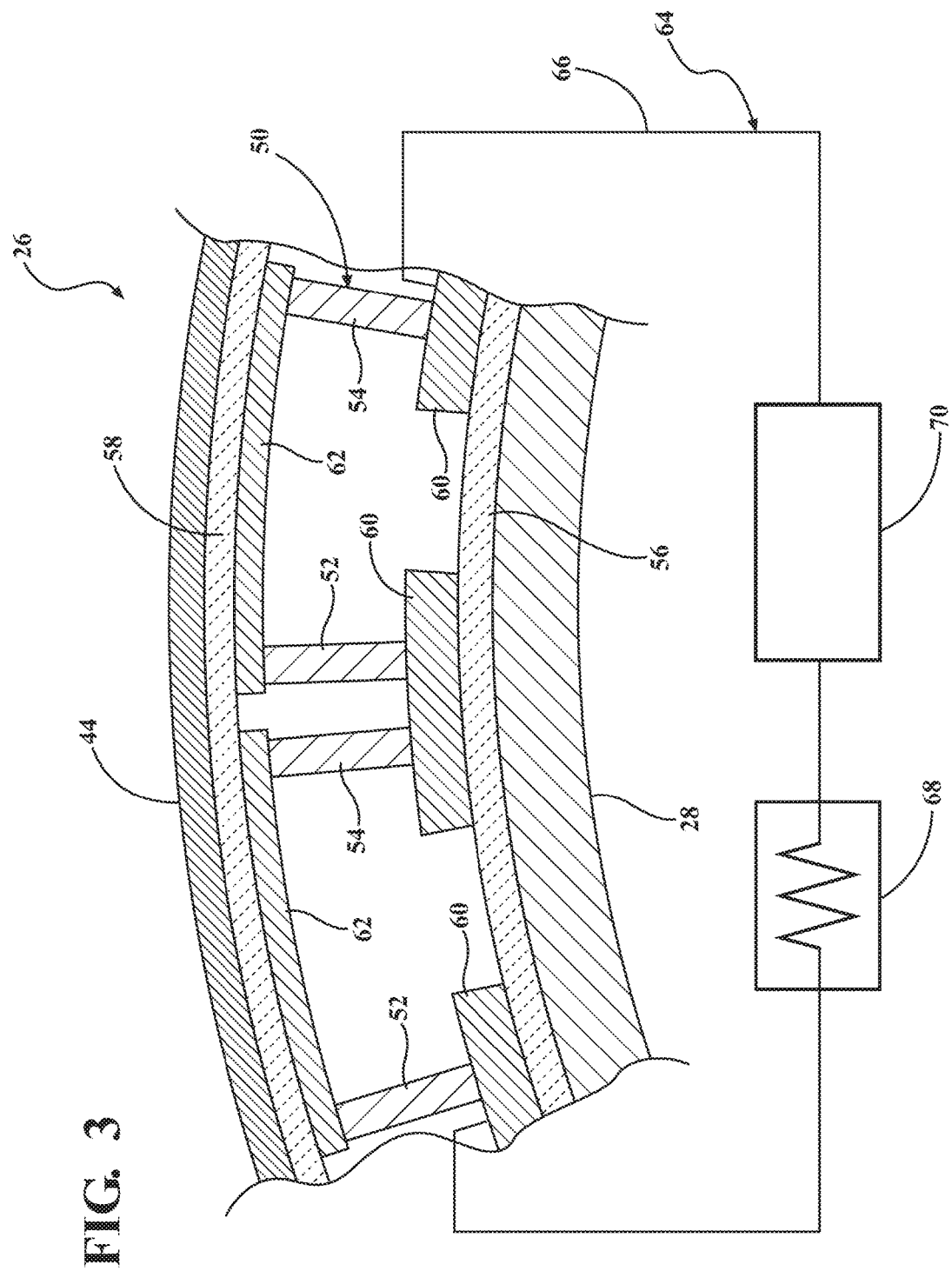
FIG. 3 is a schematic fragmentary cross sectional view of the cylinder liner.

Referring to FIG. 3, the thermoelectric element 50 includes at least one n-type semiconductor 52 and at least one p-type semiconductor 54 joined together in electrical communication. As is understood in the art, a p-type semiconductor 54 has a larger hole concentration than electron concentration. As is understood in the art, an n-type semiconductor 52 has a larger electron concentration than hole concentration. The n-type semiconductors 52 and the p-type semiconductors 54 may include semiconductors suitable for use in the cylinder liner 26 of the engine 20.

Referring to FIG. 3, the n-type semiconductors 52 and the p-type semiconductors 54 are connected in series electrically, and are positioned in concentrically about the bore axis 32, between the interior wall 28 and the exterior wall 44. The cylinder liner 26 includes a hot side electrical insulator 56, which is disposed between the interior wall 28 and the conductors of the thermoelectric element 50, i.e., the n-type semiconductors 52 and the p-type semiconductors 54. The cylinder liner 26 includes a cold side electrical insulator 58, which is disposed between the exterior wall 44 and the thermoelectric element 50. The hot side electrical insulator 56 and the cold side electrical insulator 58 may include a dielectric material suitable for use in the cylinder liner 26 of the engine 20, and that is capable of transmitting heat between the interior wall 28 and the exterior wall 44, and the n-type semiconductors 52 and the p-type semiconductors 54.

Referring to FIG. 3, the thermoelectric element 50 includes a hot side electrical conductor 60. The hot side electrical conductor 60 electrically connects the p-type semiconductors 54 and the n-type semiconductors 52 on the hot side of the thermoelectric element 50. The hot side electrical conductor 60 may include an electrical conductor suitable for use in the cylinder liner 26 of the engine 20, such as but not limited to, copper or a copper alloy. The thermoelectric element 50 includes a cold side electrical conductor 62. The cold side electrical conductor 62 electrically connects the p-type semiconductors 54 and the n-type semiconductors 52 on the cold side of the thermoelectric element 50. The cold side electrical conductor 62 may include an electrical conductor suitable for use in the cylinder liner 26 of the engine 20, such as but not limited to, copper or a copper alloy.

Referring to FIG. 3, the thermoelectric element 50 includes a circuit 64 having a lead 66 connected to the n-type semiconductors 52 and the p-type semiconductors 54. The circuit 64 connects the thermoelectric element 50 to an electrical device 68 that draws a load. The electrical device 68 may include, but is not limited to, a battery, an electric motor, a light, a DC to DC converter etc.

The circuit 64 further includes and/or is connected to an engine controller 70. The engine controller 70 may be referred to generically as a computer, a controller, a module, etc., and more specifically as an engine control unit, a vehicle control unit, a vehicle controller, etc. The engine controller 70 is operable to control the operation of the engine 20. The engine controller 70 may include a computer and/or processor, and include all software, hardware, memory, algorithms, connections, sensors, etc., necessary to manage and control the operation of the engine 20. As such, a method, described below, may be embodied as a program or algorithm operable on the engine controller 70. It should be appreciated that the engine controller 70 may include a device capable of analyzing data from various sensors, comparing data, making the necessary decisions required to control the operation of the engine 20, and executing the required tasks necessary to control the operation of the engine 20, and more specifically control the operation of the thermoelectric element 50.

The engine controller 70 may be embodied as one or multiple digital computers or host machines each having one or more processors, read only memory (ROM), random access memory (RAM), electrically-programmable read only memory (EPROM), optical drives, magnetic drives, etc., a high-speed clock, analog-to-digital (A/D) circuitry, digital-to-analog (D/A) circuitry, and required input/output (I/O) circuitry, I/O devices, and communication interfaces, as well as signal conditioning and buffer electronics.

The computer-readable memory may include non-transitory/tangible medium which participates in providing data or computer-readable instructions. Memory may be non-volatile or volatile. Non-volatile media may include, for example, optical or magnetic disks and other persistent memory. Example volatile media may include dynamic random access memory (DRAM), which may constitute a main memory. Other examples of embodiments for memory include a floppy, flexible disk, or hard disk, magnetic tape or other magnetic medium, a CD-ROM, DVD, and/or other optical medium, as well as other possible memory devices such as flash memory.

The engine controller 70 includes tangible, non-transitory memory on which are recorded computer-executable instructions, including a thermoelectric control algorithm. The processor of the engine controller 70 is configured for executing the thermoelectric control algorithm. The thermoelectric control algorithm implements a method of operating the engine 20, described in detail below.

The method of operating the engine 20 includes providing the engine 20 with a thermoelectric element 50 positioned between a combustion chamber 42 of the cylinder, and a coolant jacket 46 of the block 22. In one exemplary embodiment, the engine 20 includes the cylinder liner 26 as described above, which is disposed within the cavity 24 of the block 22. The cylinder liner 26 includes the interior wall 28 forming the cylinder, and the exterior wall 44 spaced from and disposed radially outside the interior wall 28 relative to the bore axis 32. The thermoelectric element 50 is disposed between the interior wall 28 and the exterior wall 44 of the cylinder liner 26, between the combustion chamber 42 and the coolant jacket 46.

The engine 20 is operated by igniting the fuel/air mixture within the combustion chamber 42, whereby a temperature gradient is created between the combustion chamber 42 and the coolant 48 in the coolant jacket 46. More specifically, the temperature gradient is between the interior wall 28 of the cylinder liner 26 that is exposed to the combustion chamber 42, and the exterior wall 44 of the cylinder liner 26 that is exposed to the coolant 48 in the coolant jacket 46. The fuel may include a fuel type suitable for use in the engine 20, such as but not limited to, gasoline, diesel fuel, propane, ethanol, ethanol blends, or compressed natural gas. As noted above, combustion of the fuel/air mixture releases large amounts of heat, which increases the temperature of the engine 20 components including the block 22, cylinder liner 26, cylinder head 34, etc. This creates a large temperature gradient relative to the temperature of the coolant 48 in the coolant jacket 46.

An electric current is generated in the circuit 64 using the thermoelectric element 50, from the temperature gradient between the combustion chamber 42 and the coolant 48 in the coolant jacket 46. The use of the thermoelectric element 50 to generate the electric current using a temperature gradient is understood by those skilled in the art, and is briefly described above.

The engine controller 70 may then control the electric current in the circuit 64, generated by the thermoelectric element 50, to affect a temperature within the cylinder, i.e., an in-cylinder temperature. For example, the engine controller 70 may increase the electric current in the circuit 64 to reduce the temperature within the cylinder. Alternatively, the engine controller 70 may decrease the electric current in the circuit 64 to increase the temperature within the cylinder. The thermoelectric element 50 converts heat energy into electrical energy. An increase in the electric current requires an increase in the heat consumed or used by the thermoelectric element 50 to generate the electric current. Therefore, increasing the current in the circuit 64 requires the thermoelectric element 50 to use more in-cylinder heat, which reduces the in-cylinder temperature. In contrast, a decrease in the electric current requires a decrease in the heat consumed or used by the thermoelectric element 50 to generate the electric current. Therefore, decreasing the current in the circuit 64 requires the thermoelectric element 50 to use less in-cylinder heat, which increases the in-cylinder temperature. The engine controller 70 may increase or decrease the electric current in the circuit 64 in a suitable manner as understood by those skilled in the art.

The engine controller 70 may additionally open the circuit 64 to block the electric current in the circuit 64. The engine controller 70 may open the circuit 64 by actuating a switch or other similar device as is understood by those skilled in the art. Once the circuit 64 has been opened, an open circuit 64 voltage of the thermoelectric element 50 may be measured. The open circuit 64 voltage may be measured in a suitable manner, such as with a voltmeter or other similar device capable of measuring the electrical potential in the circuit 64. The engine controller 70 may then calculate a cylinder wall temperature, e.g., a temperature of the interior wall 28 of the cylinder liner 26, from the open circuit 64 voltage of the thermoelectric element 50. The engine controller 70 may calculate the cylinder wall temperature using the open circuit 64 voltage in a suitable manner. Processes for calculating a temperature from a potential difference, e.g., a voltage, are understood by those skilled in the art, and are therefore not described in detail herein.

Once the engine controller 70 has calculated the cylinder wall temperature, the engine controller 70 may then adjust the operation of the engine 20 based on the cylinder wall temperature, or may use the calculated cylinder wall temperature for diagnostic purposes. For example, the engine controller 70 may adjust the fuel/air mixture, engine 20 timing, etc., if the engine controller 70 determines that the cylinder wall temperature is higher or lower than defined limits. In other embodiments, the engine controller 70 may use the cylinder wall temperature in a diagnostic algorithm to test the functionality of another component.

The detailed description and the drawings or figures are supportive and descriptive of the disclosure, but the scope of the disclosure is defined solely by the claims. While some of the best modes and other embodiments for carrying out the claimed teachings have been described in detail, various alternative designs and embodiments exist for practicing the disclosure defined in the appended claims.

What is claimed is:

1. An engine comprising:
   a block defining a cavity;
   a cylinder head attached to the block and covering a top end of the cavity;
   a piston movable within the cavity;
   a cylinder liner disposed within the cavity underneath the cylinder head, wherein the cylinder liner includes:
   an interior wall forming a cylinder bore extending along a bore axis and receiving therein the piston, wherein the interior wall, the cylinder head, and the piston cooperatively form therebetween a combustion chamber;
   an exterior wall spaced from and disposed radially outside the interior wall relative to the bore axis; and
   a thermoelectric generator disposed between the interior wall and the exterior wall, the thermoelectric generator including a plurality of semiconductors electrically connected in series and operable to generate an electric current in response to a temperature gradient between the interior wall and the exterior wall.

2. The engine set forth in claim 1, wherein the piston is reciprocally moveable within the cylinder bore and slidable against the interior wall of the cylinder liner.

3. The engine set forth in claim 1, wherein the cylinder liner includes a hot side electrical insulator disposed between the interior wall and the thermoelectric generator.

4. The engine set forth in claim 1, wherein the cylinder liner includes a cold side electrical insulator disposed between the exterior wall and the thermoelectric generator.

5. The engine set forth in claim 1, wherein each of the interior wall and the exterior wall is a metal.

6. The engine set forth in claim 1, wherein the cylinder head includes an intake valve and an exhaust valve, and wherein the cylinder liner is spaced from the intake and exhaust valves.

7. The engine set forth in claim 1, wherein the block defines a coolant jacket disposed adjacent the exterior wall of the cylinder liner, wherein the coolant jacket circulates a coolant therethrough.

8. The engine set forth in claim 7, wherein the exterior wall of the cylinder liner is exposed to the coolant in the coolant jacket.

9. The engine set forth in claim 1, wherein the semiconductors are circumferentially spaced from one another about the bore axis.

10. The engine set forth in claim 9, wherein the semiconductors extend radially between the interior and exterior walls of the cylinder liner relative to the bore axis.

11. The engine set forth in claim 1, wherein the plurality of semiconductors includes at least one n-type semiconductor and at least one p-type semiconductor joined together in electrical communication.

12. The engine set forth in claim 11, wherein the thermoelectric generator includes a hot side electrical conductor electrically connecting the at least one p-type semiconductor and the at least one n-type semiconductor.

13. The engine set forth in claim 11, wherein the thermoelectric generator includes a circuit having a lead connected to the at least one n-type semiconductor and the at least one p-type semiconductor.

14. The engine set forth in claim 1, wherein the cylinder liner includes a plurality of electrical conductors electrically connecting the semiconductors, the electrical conductors being circumferentially spaced from one another about the bore axis.

15. The engine set forth in claim 14, wherein the plurality of electrical conductors includes hot side and cold side electrical conductors, the cold side electrical conductor being spaced radially outward from the hot side electrical conductor with respect to the bore axis.

16. The engine set forth in claim 15, wherein the plurality of semiconductors and the plurality of electrical conductors are sandwiched between the interior and exterior walls of the cylinder liner.

17. A cylinder liner for an internal combustion engine having a block with a cavity, a cylinder head attached to the block and covering one end of the cavity, and a piston movable within the cavity, the cylinder liner comprising:
   an interior wall configured to position within the cavity underneath the cylinder head, the interior wall forming a cylinder bore extending along a bore axis and configured to receive therein the piston such that the interior wall, the cylinder head, and the piston cooperatively form therebetween a combustion chamber;

an exterior wall configured to position within the cavity underneath the cylinder head, the exterior wall being spaced from and disposed radially outside the interior wall relative to the bore axis; and a thermoelectric generator disposed between the interior wall and the exterior wall, the thermoelectric generator including a plurality of semiconductors electrically connected in series and operable to generate an electric current in response to a temperature gradient between the interior wall and the exterior wall.

18. The cylinder liner set forth in claim 17, further comprising:
    a hot side electrical insulator disposed between the interior wall and the thermoelectric generator; and
    a cold side electrical insulator disposed between the exterior wall and the thermoelectric generator,
    wherein the plurality of semiconductors includes at least one n-type semiconductor and at least one p-type semiconductor joined together in electrical communication.

19. The cylinder liner set forth in claim 18, further comprising:
    a hot side electrical conductor electrically connecting the at least one p-type semiconductor and the at least one n-type semiconductor; and
    a circuit having a lead connected to the at least one n-type semiconductor and the at least one p-type semiconductor.

20. An internal combustion engine assembly comprising:

an engine block defining therein a cavity;

a cylinder head attached to the engine block and covering one end of the cavity, the cylinder head including an intake valve and an exhaust valve;

a piston reciprocally movable within the cavity;

a cylinder liner mounted within the cavity of the engine block and spaced from the cylinder head and the intake and exhaust valves, the cylinder liner including:
    a cylindrical interior wall defining a cylinder bore with a bore axis, the cylinder bore slidably receiving therein the piston, and the interior wall, the cylinder head, and the piston cooperatively forming therebetween a combustion chamber;
    a cylindrical exterior wall spaced radially outward from the interior wall; and
    a thermoelectric generator encased within the cylinder liner between the interior and exterior walls, the thermoelectric generator including a plurality of semiconductors circumferentially spaced from one another about the bore axis and electrically connected in series to generate an electric current in response to a temperature gradient between the interior and exterior walls.

* * * * *